United States Patent
Ahn et al.

(10) Patent No.: US 7,394,185 B2
(45) Date of Patent: Jul. 1, 2008

(54) PLASMA DISPLAY APPARATUS HAVING HEAT DISSIPATING STRUCTURE FOR DRIVER INTEGRATED CIRCUIT

(75) Inventors: Joong-Ha Ahn, Suwon-si (KR); Nam-Sung Jung, Suwon-si (KR); Sung-Won Bae, Suwon-si (KR); Hyouk Kim, Suwon-si (KR)

(73) Assignee: Samsung SDI Co., Ltd., Suwon-si, Gyeonggi-do (KR)

(*) Notice: Subject to any disclaimer, the term of this patent is extended or adjusted under 35 U.S.C. 154(b) by 489 days.

(21) Appl. No.: 10/961,164

(22) Filed: Oct. 12, 2004

(65) Prior Publication Data

US 2005/0088071 A1    Apr. 28, 2005

(30) Foreign Application Priority Data

Oct. 23, 2003   (KR) .................... 10-2003-0074256

(51) Int. Cl.
*H01J 17/49* (2006.01)
*G09G 3/10* (2006.01)

(52) U.S. Cl. .................... 313/46; 313/582; 361/681

(58) Field of Classification Search ......... 313/582–587, 313/46; 361/681
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Shinoda et al. | |
| 5,724,054 A | 3/1998 | Shinoda | |
| 5,726,491 A * | 3/1998 | Tajima et al. | 358/1.18 |
| 5,786,794 A | 7/1998 | Kishi et al. | |
| 5,952,782 A | 9/1999 | Nanto | |
| RE37,444 E | 11/2001 | Kanazawa | |
| 6,534,722 B2 * | 3/2003 | Takaoka | 174/254 |
| 6,630,916 B1 | 10/2003 | Shinoda | |
| 6,707,436 B2 | 3/2004 | Setoguchi et al. | |
| 2001/0024198 A1 * | 9/2001 | Oishi et al. | 345/204 |

(Continued)

FOREIGN PATENT DOCUMENTS

CN        1402319        3/2003

(Continued)

OTHER PUBLICATIONS

*"Final Draft International Standard"*, Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Karabi Guharay
(74) *Attorney, Agent, or Firm*—Robert E. Bushnell, Esq.

(57) ABSTRACT

A plasma display apparatus includes a plasma display panel and a chassis base extending substantially parallel to the plasma display panel. The chassis base has a driving circuit mounted thereon in opposition to the plasma display panel. A driver IC faces the chassis base, and is packaged in a film-shaped assembly. A thermal conduction medium is disposed and solidified between the driver IC and the chassis base so as to dissipate the heat generated at the driver IC.

18 Claims, 2 Drawing Sheets

U.S. PATENT DOCUMENTS

2003/0020152 A1 * 1/2003 Inoue et al. ................. 257/684

FOREIGN PATENT DOCUMENTS

| | | |
|---|---|---|
| JP | 64-055850 | 3/1989 |
| JP | 64-68327 A * | 3/1989 |
| JP | 02-148645 | 6/1990 |
| JP | 08-242054 | 9/1996 |
| JP | 2845183 | 10/1998 |
| JP | 2917279 | 4/1999 |
| JP | 11-274673 | 10/1999 |
| JP | 2001-043804 | 2/2001 |
| JP | 2001-325888 | 11/2001 |

* cited by examiner

PLASMA DISPLAY APPARATUS HAVING HEAT DISSIPATING STRUCTURE FOR DRIVER INTEGRATED CIRCUIT

CLAIM OF PRIORITY

This application makes reference to, incorporates the same herein, and claims all benefits accruing under 35 U.S.C. §119 from an application for PLASMA DISPLAY APPARATUS HAVING HEAT DISSIPATING STRUCTURE FOR DRIVER IC earlier filed in the Korean Intellectual Property Office on 23 Oct. 2003 and there duly assigned Serial No. 2003-74256.

BACKGROUND OF THE INVENTION

1. Field of the Invention

The present invention relates to a plasma display apparatus and, more particularly, to a plasma display apparatus having a heat dissipating structure for a driver integrated circuit (IC).

2. Description of Related Art

Generally, a plasma display apparatus has a plasma display panel for displaying the desired images based on the plasma generated due to gas discharge. The electrodes provided at the plasma display panel are electrically connected to a driving circuit, and a driver IC applies address voltages to the electrodes in accordance with the signals controlled at the driving circuit.

Among voltage application structures using a driver IC, there are a chip on board (COB) structure wherein the driver IC is mounted on a printed circuit board (PCB), and a chip on film (COF) structure wherein the driver IC is directly mounted on a flexible printed circuit (FPC) formation film. Recently, a small-sized and low cost tape carrier package (TCP) has been extensively used as the voltage application structure.

Meanwhile, in order to express 256 grays or more with a plasma display panel, at least eight-timed address discharges should be made for 1/60 second corresponding to the one TV field, and hence, much heat is generated in the COF, the COB or the TCP structures mounted on the chassis base.

Accordingly, a reinforcing plate is provided at the COB or the COF structure to reinforce its structural intensity and fix it to the chassis base. The reinforcing plate has the further role of a heat sink to dissipate the heat generated at the IC to the exterior.

Meanwhile, in order to dissipate the heat generated at the driver IC of the TCP structure, a liquid or gel-typed thermal conduction medium is disposed between the driver IC and the chassis base to transfer the heat to the chassis base.

However, with respect to the plasma display apparatus with the above heat dissipating structure, when it is checked or repaired, the thermal conduction medium is diffused toward the periphery of the driver IC to thereby form a predetermined gap between the driver IC and the chassis base. Accordingly, the heat conducted from the driver IC via the thermal conduction medium is not efficiently transferred to the chassis base due to the gap between the driver IC and the chassis base so that the heat at the driver IC is not dissipated.

SUMMARY OF THE INVENTION

It is an object of the present invention to provide a plasma display apparatus which has a heat dissipating structure for a driver IC capable of enhancing the heat dissipating efficiency of the driver IC.

This and other objects may be achieved by a plasma display apparatus with the following features.

The plasma display apparatus includes a plasma display panel and a chassis base extending substantially parallel to the plasma display panel. The chassis base has a driving circuit mounted thereon in opposition to the plasma display panel. A driver IC faces the chassis base, and is packaged in a film-shaped assembly. A thermal conduction medium is disposed and solidified between the driver IC and the chassis base so as to dissipate the heat generated in the driver IC.

The driver IC is preferably formed as a tape carrier package (TCP). The TCP packages the driver IC with a TCP tape, and electrically interconnects the plasma display panel and the driving circuit via the TCP tape.

The thermal conduction medium has a heat dissipating structure for the driver IC and in contains a hardening epoxy resin.

A subsidiary medium may fill the gap between the thermal conduction medium and the chassis base. The subsidiary medium has a heat dissipating structure for the driver IC and contains silicon oil or thermal grease.

Alternatively, the subsidiary medium may contain a hardening epoxy resin, and is disposed and solidified between the thermal conduction medium and the chassis base.

A compression plate may face the driver IC, and has a heat dissipating structure for the driver IC extending parallel to the chassis base.

A thermal conduction medium may be disposed between the compression plate and the driver IC. The thermal conduction medium is in the form of a silicon sheet.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which preferred embodiments of the invention are shown.

Figure 1:
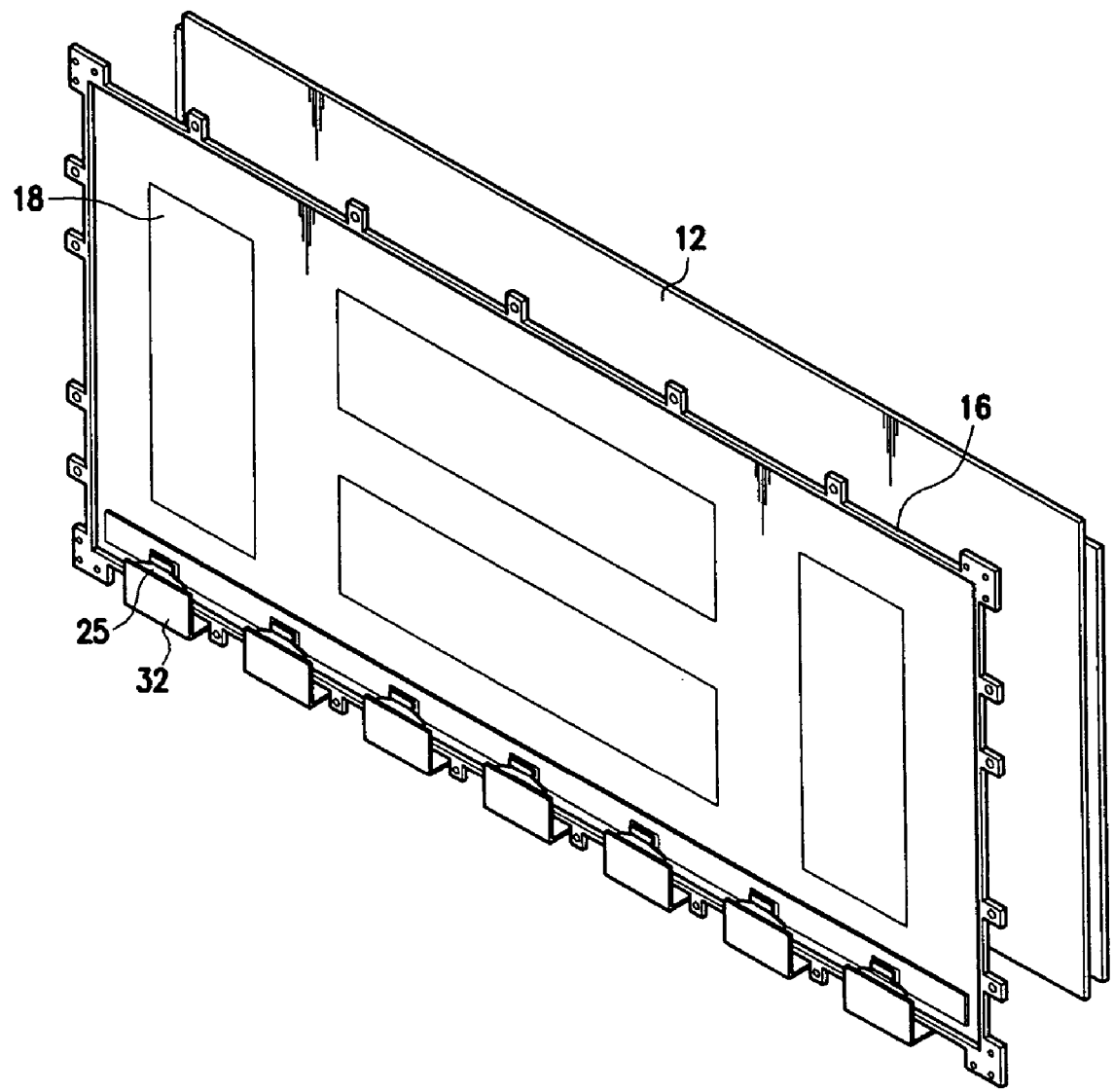
FIG. 1 is an exploded perspective view of a plasma display apparatus according to a first embodiment of the present invention.
Figure 2:
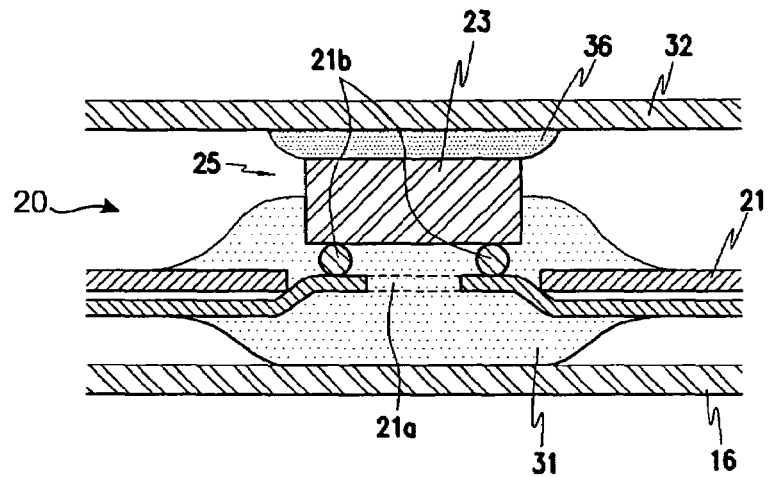
FIG. 2 is a cross-sectional view of a heat dissipating structure for the driver IC of the plasma display apparatus according to the first embodiment of the present invention.

FIG. 1 is an exploded perspective view of a plasma display apparatus according to a first embodiment of the present invention, and FIG. 2 is a cross-sectional view of a heat dissipating structure for the driver IC of the plasma display apparatus according to the first embodiment of the present invention.

As shown in FIG. 1, the plasma display apparatus basically includes a plasma display panel 12 (referred to hereinafter simply as the "PDP"), and a chassis base 16. The PDP 12 is mounted adjacent to the side surface of the chassis base 16, and a driving circuit 18 is mounted at an opposite side surface of the chassis base 16. The PDP 12 has a structure wherein electrodes for receiving the display signals are drawn from the periphery thereof. The electrodes are electrically connected to the driving circuit 18 via connectors 20 so as to receive the signals required for driving the PDP 12.

As seen in FIG. 2, the connector 20 is structured in the form of a TCP 25. The TCP 25 has a TCP tape 21 electrically interconnecting the electrode of the PDP 12 and the driving circuit 18, and a driver IC 23 mounted over the TCP tape 21.

The TCP tape 21 has a film-shaped FPC structure. The TCP tape 21 extends from the periphery of the PDP 12 to the periphery of the driving circuit 18 while passing through the chassis base 16 to electrically interconnect the electrode of the PDP 12 and the driving circuit 18.

The driver IC 23 is mounted over a hole 21a of the TCP tape 21 in the form of a package, and electrically interconnects the electrode of the PDP 12 and the driving circuit 18 via bumps 21b. The driver IC 23 selectively applies a predetermined voltage to the electrode of the PDP 12 in accordance with control signals from the driving circuit 18.

A thermal conduction medium 31 is disposed between the driver IC 23 and the chassis base 16. With the driving of the plasma display apparatus, the thermal conduction medium 31 transfers heat generated in the driver IC 23 to the chassis base 16.

With the heat dissipating structure for the driver IC 23 according to the first embodiment of the present invention, the thermal conduction medium 31 is disposed in the space between the driver IC 23 mounted over the hole 21a and the chassis base 16, and is hardened so as to be in a solid state.

The thermal conduction medium 31 is composed of a thermal compound containing a hardener, such as epoxy resin. The epoxy resin is hardened from the liquid state with a high viscosity so as to assume a solid state due to the hardener.

With the above-structured plasma display apparatus, the thermal conduction medium 31 is disposed in the empty space between the driver IC 23 and the chassis base 16 in a liquid state, and is fitted to the chassis base 16. When the plasma display apparatus is operated, the heat generated in the driver IC 23 is efficiently transferred to the chassis base 16 via the thermal conduction medium 31. Since the thermal conduction medium 31 is in a solidly hardened state, it cannot disperse around the driver IC 23 when device checking or repairing is carried out.

EXAMPLE

In relation to a 42-inch PDP module provided with a TCP, a thermal conduction medium composed of a hardening thermal conduction compound was formed between the chassis base and the driver IC (according to an embodiment of the present invention), and a thermal conduction member composed of a liquid or gel-typed liquid thermal conduction compound was formed between the chassis base and the driver IC (according to the prior art). The thermal conductivity of the hardening thermal conduction compound and the liquid thermal conduction compound, and the temperature of the IC part were measured, and compared.

TABLE 1

| Division | Liquid thermal conduction compound | First hardening thermal conduction compound | Second hardening thermal conduction compound | Third hardening thermal conduction compound | Fourth hardening thermal conduction compound | Fifth hardening thermal conduction compound | Sixth hardening thermal conduction compound |
| --- | --- | --- | --- | --- | --- | --- | --- |
| Thermal conductivity (W/m · k) | 0.1 | 0.84 | 0.92 | 1.59 | 1.92 | 0.83 | 1.34 |
| IC temperature (deg. C) | 58.7 | 58.4 | 58.2 | 57.4 | 56.1 | 58.1 | 56.6 |

As shown in Table 1, the thermal conductivity of the thermal conduction medium based on the hardening thermal conduction compound was higher than that of the thermal conduction member based on the liquid thermal conduction compound, and the temperature of the driver IC in the former case was lower than that in the latter case. That is, with the thermal conduction medium formed between the driver IC and the chassis base while being hardened so as to be in a solid state, the heat generated in the driver IC can be transferred in an effective manner to the chassis base performing the role of a heat sink, thereby providing efficient heat dissipation.

The hardening thermal conduction compounds listed in Table 1 are based on the products of the US company, Dow Corning.

Meanwhile, when the thermal conduction medium 31 is hardened between the driver IC 23 and the chassis base 16, it is liable to be distorted or shrunk so that a gap is formed at the interface between the thermal conduction medium 31 and the chassis base 16.

Figure 3:
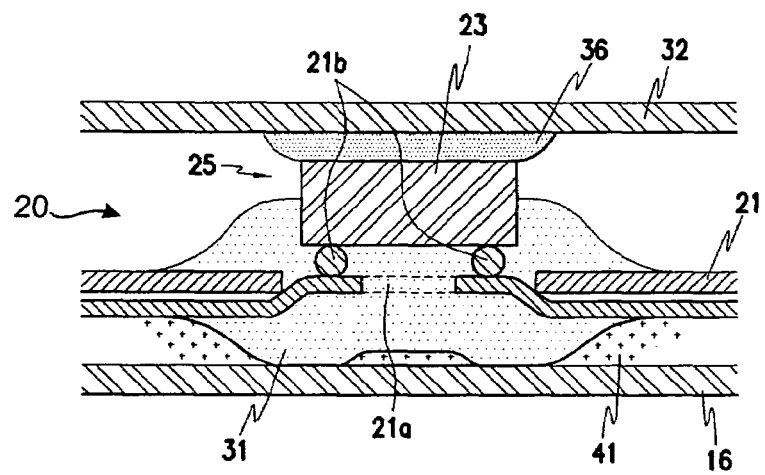
FIG. 3 is a cross-sectional view of a heat dissipating structure for a driver IC of a plasma display apparatus according to a second embodiment of the present invention.

In this connection, with a plasma display apparatus according to a second embodiment of the present invention, as shown in FIG. 3, a subsidiary medium 41 is disposed between the thermal conduction medium 31 and the chassis base 16.

The subsidiary medium 41 is formed from a liquid or gel-type thermal conduction compound which contains silicon oil or thermal grease. The subsidiary medium 41 eliminates the gap between the solidly hardened thermal conduction medium 31 and the chassis base 16, thereby enhancing the heat dissipating efficiency of the driver IC 23.

When the display apparatus is checked or repaired, the subsidiary medium 41 is liable to be dispersed toward the periphery of the driver IC 23 so that a predetermined gap may be formed between the thermal conduction medium 31 and the chassis base 16.

Figure 4:
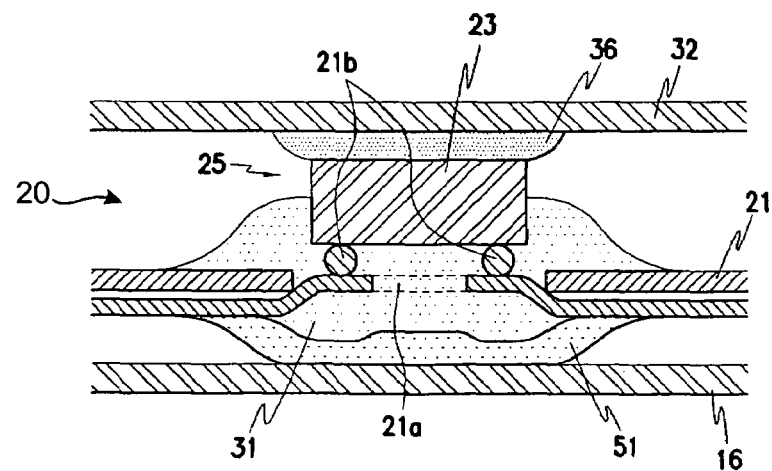
FIG. 4 is a cross-sectional view of a heat dissipating structure for a driver IC of a plasma display apparatus according to a third embodiment of the present invention.

In this connection, with a plasma display apparatus according to a third embodiment of the present invention, as shown in FIG. 4, a subsidiary medium 51 composed of a hardening thermal conduction compound, similar to the thermal conduction medium 31, is disposed between the solid thermal conduction medium 31 and the chassis base 16.

In this embodiment, the subsidiary medium 51 is disposed between the thermal conduction medium 31 and the chassis base 16 in a liquid state, and is hardened so as to be in a solid state, thereby completely eliminating the gap, and adhering the TCP 25 to the chassis base 16.

Therefore, the possibility of a gap between the driver IC 23 and the chassis base 16 is completely eliminated due to presence of the thermal conduction medium 31 and the subsidiary medium 51, thereby enhancing the heat dissipating efficiency of the driver IC 23.

Meanwhile, as shown in FIGS. 1 to 4, a compression plate 32 may be provided external to the driver IC 23 so as to compress the driver IC 23 against the chassis base 16. The compression plate 32 is formed of aluminum, copper or iron, as is the case with the chassis base 16. The compression plate 32 is fixed to the chassis base 16 via a coupling member, such as a screw. Furthermore, a thermal conduction medium 36 is disposed between the compression plate 32 and the driver IC 23. The thermal conduction medium 36 transfers heat generated in the driver IC 23 to the compression plate 32. A silicon sheet attached to the compression plate 32 may function as the thermal conduction medium 36. Consequently, the heat generated in the driver IC 23 can be dissipated through the thermal conduction medium 36 and the compression plate 32.

As described above, with the plasma display apparatus having a heat dissipating structure for a driver IC, the gap between the driver IC and the chassis base is completely eliminated due to the thermal conduction medium composed of a hardening thermal conduction compound, thereby enhancing the heat dissipating efficiency of the driver IC and the reliability of the driver IC.

Although preferred embodiments of the present invention have been described in detail hereinabove, it should be clearly understood that many variations and/or modifications of the basic inventive concept, which may appear to those skilled in the art, will still fall within the spirit and scope of the present invention, as defined in the appended claims.

What is claimed is:

1. A plasma display apparatus, comprising:
   a plasma display panel;
   a chassis base disposed substantially parallel to the plasma display panel, the chassis base having a driving circuit mounted thereon in opposition to the plasma display panel;
   a driver IC facing the chassis base, the driver IC being packaged in a film-shaped assembly;
   a thermal conduction medium disposed on a given side of the driver IC and solidified between the given side of the driver IC and the chassis base for dissipating heat generated in the driver IC, wherein at least a part of the thermal conduction medium is in contact with the chassis base; and
   a subsidiary medium disposed on the given side of the driver IC and in contact with the thermal conduction medium for filling a gap between the thermal conduction medium and the chassis base.

2. The plasma display apparatus of claim 1, wherein the driver IC is included within a tape carrier package (TCP).

3. The plasma display apparatus of claim 2, wherein the TCP includes a TCP tape which electrically interconnects the plasma display panel and the driving circuit.

4. The plasma display apparatus of claim 1, wherein the thermal conduction medium has a heat dissipating structure containing a hardening epoxy resin.

5. The plasma display apparatus of claim 1, wherein the subsidiary medium has a heat dissipating structure containing one of silicon oil and thermal grease.

6. The plasma display apparatus of claim 1, wherein the subsidiary medium has a heat dissipating structure containing a hardening epoxy resin, and is disposed and solidified between the thermal conduction medium and the chassis base.

7. The plasma display apparatus of claim 1, further comprising a compression plate which faces the driver IC, and which has a heat dissipating structure extending parallel to the chassis base.

8. The plasma display apparatus of claim 7, further comprising an additional thermal conduction medium disposed between the compression plate and the driver IC.

9. The plasma display apparatus of claim 8, wherein the additional thermal conduction medium is in the form of a silicon sheet.

10. A plasma display apparatus, comprising:
    a plasma display panel;
    a chassis base disposed substantially parallel to the plasma display panel, the chassis base having a driving circuit mounted thereon in opposition to the plasma display panel;
    a driver IC having a first side facing the chassis base; and
    a thermal conduction medium disposed on the first side of the driver IC and solidified between the first side of the driver IC and the chassis base for dissipating heat generated in the driver IC;
    wherein at least a part of the thermal conduction medium is in contact with the chassis base,
    said plasma display apparatus further comprising a subsidiary medium which fills a gap between the thermal conduction medium and the chassis base.

11. The plasma display apparatus of claim 10, wherein the driver IC is included within a tape carrier package (TCP).

12. The plasma display apparatus of claim 11, wherein the TCP includes a TCP tape which electrically interconnects the plasma display panel and the driving circuit.

13. The plasma display apparatus of claim 10, wherein the thermal conduction medium has a heat dissipating structure containing a hardening epoxy resin.

14. The plasma display apparatus of claim 10, wherein the subsidiary medium has a heat dissipating structure containing one of silicon oil and thermal grease.

15. The plasma display apparatus of claim 10, wherein the subsidiary medium has a heat dissipating structure containing a hardening epoxy resin, and is disposed and solidified between the thermal conduction medium and the chassis base.

16. The plasma display apparatus of claim 10, further comprising a compression plate which faces the driver IC, and which has a heat dissipating structure extending parallel to the chassis base.

17. The plasma display apparatus of claim 16, further comprising an addition thermal conduction medium disposed between the compression plate and the driver IC.

18. The plasma display apparatus of claim 17, wherein the additional thermal conduction medium is in the form of a silicon sheet.

* * * * *